Nov. 10, 1970 D. C. LEPIANE 3,539,391
METHOD OF COATING SEMICONDUCTOR MATERIALS WITH CONDUCTIVE METALS
Original Filed Sept. 20, 1966
FLOW DIAGRAM
EXAMPLE OF COMPLETE METHOD OF MAKING DOUBLE-DIFFUSED SILICON DIODES
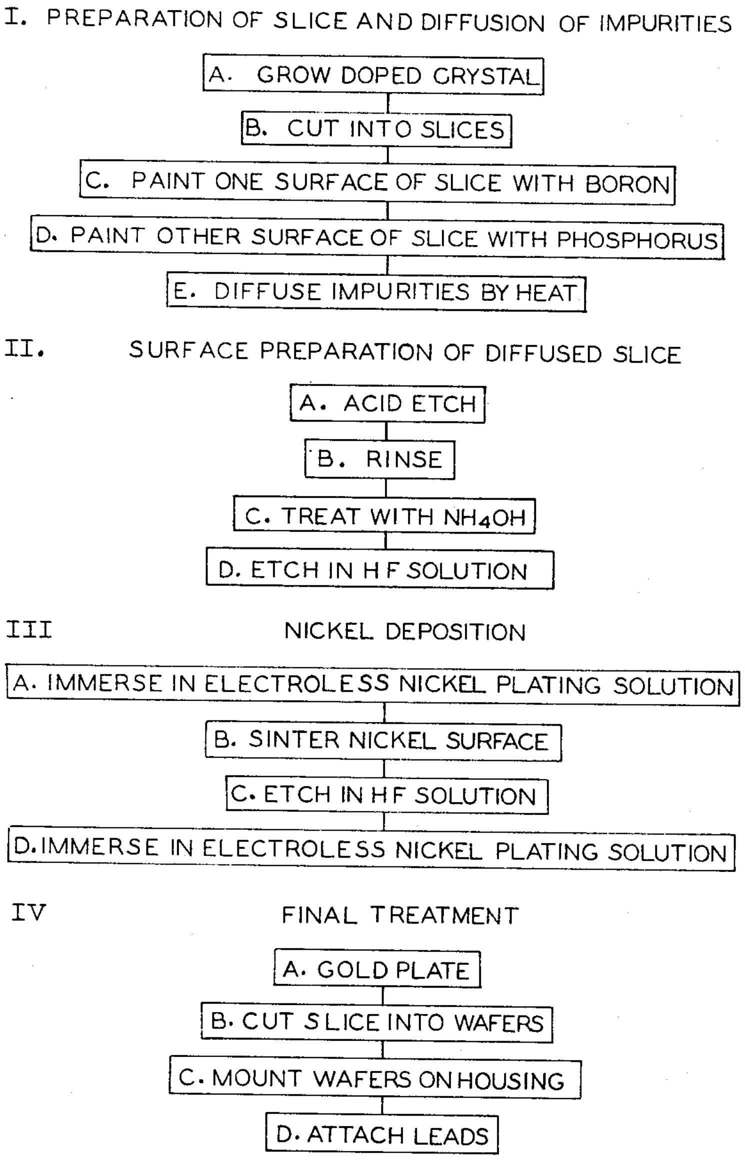
INVENTOR
D. C. LEPIANE
BY J. J. Landis
ATTORNEY

1

3,539,391

METHODS OF COATING SEMICONDUCTOR MATERIALS WITH CONDUCTIVE METALS

Donald C. Lepiane, Reading, Pa., assignor to Western Electric Company, Incorporated, New York, N.Y., a corporation of New York Continuation of application Ser. No. 580,742, Sept. 20, 1966. This application Sept. 30, 1969, Ser. No. 863,033
Int. Cl. C23c 3/02; H01l 7/50
U.S. Cl. 117—213 8 Claims

ABSTRACT OF THE DISCLOSURE

Before metalizing a silicon base semiconductor slice in an electroless plating bath, glassy phosphosilicate and glassy borosilicate layers that form on opposite sides of the slice during thermal diffusion must be removed. A known method of removing the glassy layers is the immersion of the slice in hydrofluoric acid; however, it is during the removal of the glassy layers that the surface underlying the glassy phosphosilicate is rendered passive for subsequent electroless deposition of a metal. In order to eliminate this passive condition and present an active surface that will receive a uniform and adherene plating of metal, the slice is immersed in a hot aqueous ammonium hydroxide solution after the removal of the glassy and prior to the metal plating.

This application is a continuation of application Ser. No. 580,742, filed Sept. 20, 1966, now abandoned.

This invention relates generally to methods of coating semiconductive materials with conductive metals and more particularly to methods of plating phosphorus-diffused silicon surfaces with adherent coatings of electroless nickel.

As a first step in the manufacture of semiconductors, it is as conventional to grow a large crystal from various semiconductive materials, such as silicon, germanium, or from Group III–V compounds. In accordance with one well known manufacturing method, the melt from which the crystal is grown is doped with a conductivity-determining impurity (e.g. a Group III or V element) so that the entire crystal will have either p- or n-type conductivity. The resulting p- or n-type crystal is then subdivided into a series of thin discs, referred to as "slices," and the slices are treated with additional conductivity-determining impurities to establish one or more p-n junctions therein. After the desired number and type of p-n junctions have been established in the slice, the slice is subdivided into many hundreds of small chips, referred to as "wafers." The manufacture of semiconductors is then completed by mounting the wafer, and connecting the active regions of the wafer to appropriate electrical leads.

It is a matter of some difficulty to obtain a strong mechanical and low ohmic connection between portions of the surface of wafers and the leads. To avoid this problem, some commercially available diodes utilize spring-biased leads that press against the surface of the wafer. This arrangement is unreliable if vibrations or shocks are encountered in use and, further, is disadvantageous in that it may crack the wafer. In other instances, the conductive leads have been attached to the wafer by soldering the leads to the surface. This has not proven satisfactory, since it is difficult to wet the surface of the wafer with solder.

By one of the better techniques that has been proposed for obtaining a secure bond between the electrical leads and the wafer, the slice, before being cut into wafers, is coated with a conductive metal so that the electrical leads can then be securely bonded to the surfaces of the wafers, as by thermocompression bonding, or soldering, etc. One

2 known method for accomplishing this utilizes a coating of metallic neckel that is deposited on the surface of the slice by the well-known "electroless" plating method. If desired, after the nickel coating has been deposited upon the face of the slice, additional conductive layers can be deposited on the nickel surface by conventional electroplating methods.

While the above techniques have proven useful difficulties have been encounter in obtaining a uniform and tightly adherent coating of nickel on the desired surface regions of the device, particularly over both surfaces of the slice as is desirable for some types of diffused silicon diodes. These difficulties are generally caused due to the prior treatment of the slice in preparing its surface for treatment in the electroless bath. For example, before the slice can be placed in the electroless bath, it is necessary to remove portions of the surfaces of the slice that have become contaminated by glassy layers during the diffusion of doping impurities into the slice. If only one surface of the slice has been doped, removal of the glassy layers may not be too difficult, since reagents are available that will remove the glassy layers from both the doped and undoped surfaces of the slice. However, if one surface of the slice is doped with one impurity and another surface with another impurity, the two surfaces may be sufficiently different chemically to require each surface of the slice to be given a separate chemical treatment.

By way of example, reference is made to a silicon slice that is doped on one side with phosphorus and on its other side with boron. In this instance, prior to placing the wafer in an electroless nickel plating solution, it is necessary to remove the products of oxidation which are essentially a phosphosilicate glass on one side and a borosilicate glass on the other side. While both of these glassy surfaces may be dissolved in a hydrofluoric acid bath, the effect of the hydrofluoric acid is different on each side; that is, hydrofluoric acid will readily attack the phosphosilicate glass, but has markedly less affinity for the borosilicate glass. Accordingly, if the slice is immersed in a hydrofluoric acid bath for sufficient time to remove the phosphosilicates, the borosilicates will remain. On the other hand, if the slice remains in the bath for a sufficient length of time to remove the borosilicate layer, the phosphorus-diffused surface is, by some unknown mechanism, rendered passive with respect to the electroless nickel bath. By this is meant that the nickel does not plate uniformly over the surfaces of the slice and, even on those portions where it does plate, comparatively poor adhesion is obtained. Thus, as is known in the prior art (see Andres Pat. 2,962,394), if an effective nickel coating is to be obtained, each surface of the slice must receive separate chemical treatment to remove its oxide layer.

Accordingly, it is an object of this invention to provide new and improved methods of depositing uniform and adherent conductive metallic coatings on the surfaces of semiconductive materials, such as diffused silicon slices.

Another object of this invention is to provide improved methods of conditioning the surfaces of semiconductive slices for receiving a uniform and adherent conductive metal coating, particularly for electroless nickel plating.

Still another object of this invention is to provide treating methods whereby borosilicate and phosphosilicate surfaces of double-diffused silicon slices may be etched with hydrofluoric acid at the same time, and both surfaces rendered active with respect to an electroless plating solution.

Briefly, these and other objects of the invention are achieved by cleaning the surface regions of a diffused body of semiconductive material, and activating the surface regions to be plated by treatment with ammonium hydroxide prior to electroless plating of a conductive metal. In a preferred example, a phosphorus-boron, double diffused silicon slice is immersed in hydrofluroic acid for a sufficient time to dissolve glassy surface layers. The clean surfaces are then activated by immersion in a hot aqueous solution of ammonium hydroxide. For reasons not clearly understood, the phosphorus surface of the slice becomes reactivated with respect to the electroless plating solution when it is exposed to the ammonium hydroxide and, accordingly, a uniform and tightly adherent coating of conductive metal such as nickel can be plated over the surface of the slice.

One example of a complete method of making double-diffused silicon diodes, illustrating certain features of the invention, is illustrated by the flow sheet of the drawing. In more detail, the important steps in the method are discussed below.

(I) PREPARATION OF THE SLICE AND DIFFUSION OF IMPURITIES

As these steps do not form a part of the present invention and are generally known in the art, they will receive only brief mention. First, a semiconductive slice is cut from a large single crystal that may be doped with either an n- or p-type material. One surface of this slice is coated with an acceptor solution such as one comprised of boric acid anhydride in a glycol/ether solution, and the other surface is coated with a donor solution such as one comprised of phosphorus pentoxide in a glycol/ether solution. These solutions are applied to opposite sides of each slice, as by painting, and the slices so painted are stacked and heated in a furnace at elevated temperatures for a sufficient time to thermally diffuse the boron and phosphorus into the slice and achieve the desired junction characteristics.

(II) SURFACE PREPARATION OF THE DIFFUSED SLICE

During the above diffusion step, oxide layers form over the surfaces of the slice that must be removed prior to plating, as previously mentioned. As these oxide layers are in the nature of glassy materials, known in the art as phosphosilicate and borosilicate "glass," they must be removed by dissolving them in a hydrofluoric acid bath. It will be understood that the time the slice must remain in the acid bath will depend upon such factors as the strength and temperature of the acid bath, as well as the thickness of the glassy layer formed over the surface of the slice. As a general rule, immersion of the slice into a room temperature concentrated hydrofluoric acid bath for about twelve minutes will suffice to remove the glassy layers from both the boron and phosphorus-diffused sides of the slice.

After the slice is removed from the acid, it is rinsed and, in accordance with this invention, is then treated in a bath of ammonium hydroxide. While the exact parameters of the $NH_4OH$ bath are not highly critical, it has been found that best results, for the specific type of diode under consideration, are obtained if the slice is immersed in an aqueous $NH_4OH$ solution for about four to six minutes, while the solution has a pH of the order of 8 to 10 (preferably about 9), and is heated to a temperature of the order of 80–80° C. (preferably about 85° C.). The slice is then removed from the ammonium hydroxide solution, air dried, and reimmersed for about three minutes in the hydrofluoric acid bath in order to remove any oxides that may have formed during drying or immersion in the ammonium hydroxide solution. After the slice is removed from the hydrofluoric acid, it is given a final rinse and immersed in an electroless nickel plating solution. If the slice is not so treated in the ammonium hydroxide bath, it has been found that a uniform and adherent layer of nickel will not be deposited over the slice by the electroless nickel solution, discussed below, particularly on the phosphorus side.

(III) NICKEL DESPOSITION

Nickel plating with an electroless solution is well known in the art and will not be described in detail here. In general, the slice is immersed for a period of about two minutes in an electroless nickel plating solution, one typical bath being comprised of nickelous chloride and sodium hypophosphite, to form a relatively thin coating of nickel over both sides of the slice. According to preferred practice, the slice is then dried and heated in a furnace at about 840° C. for a sufficient time to sinter the nickel into both surfaces of the slice. The slice is then removed from the furnace, reimmersed in the hydrofluoric acid solution for about fifteen seconds to remove any oxide layer that might have formed during the sintering operation, and reimmersed in the electroless nickel plating solution for about five minutes to build up an additional coating layer thereover. If desired, additional layers of conductive metal may be built up over the surface of the nickel either from electroless sloutions or, at this point, by utilizing standard electroplating techniques.

(IV) FINAL TREATMENT

While not necessary in the practice of this invention, it is often desirable to lay down a coating of gold over the nickel surface as by electrodeposition processes. After this is accomplished, the slice is cut into many small wafers, the individual wafers are suitably mounted in or on housings and electrical leads are attached to the surfaces of the wafers as by thermocompression bonding, soldering, or other known metal-bonding techniques. By these means, a strong-mechanical and low-ohmic connection between the electrical leads and the surfaces of the wafers is achieved.

From the foregoing, it can be understood that this invention in the specific, preferred embodiment makes it possible to utilize a single reagent to remove the glassy layers from both surfaces of a double-diffused silicon slice in preparation for coating the slice in an electroless plating solution. This is made possible by immersing the slice in hydrofluoric acid for a time sufficient to dissolve both the phosphosilicate glass and the p-type glass (such as borosilicate glass) from the diffused surfaces of the slice, and then activating the phosphorus-diffused surface by contact with ammonium hydroxide. If the phosphorus-diffused surface is not so activated with ammonium hydroxide prior to coating in the electroless plating solution, an imperfect and poorly adherent layer of the conductive metal will be deposited on the phosphorus-diffused surface of the slice.

Although certain embodiments and examples of the invention have been shown in the drawing and described in detail in the specification, it will be understood that various modifications may be made from the specific details described without departing from the spirit and scope of the invention.

What is claimed is:

1. In a method of activating a surface of a silicon slice which is in a passive state, said surface in the passive state having diffused phosphorous therein which has been exposed by treating a glassy phosphosilicate overlaying layer with hydrofluoric acid for sufficient time to remove the phosphosilicate layer and render passive the underlaying diffused phosphorous surface:

applying ammonium hydroxide to the passive surface to activate this surface to receive an electroless deposition of nickel.

2. The method according to claim 1 wherein the Ph of the ammonium hydroxide is of the order of 8–10.

3. The method according to claim 2 wherein the ammonium hydroxide is heated to a temperature of 80–90° C.

4. The method according to claim 1 wherein the ammonium hydroxide is heated to a temperature of 80–90° C.

5. A method of coating a silicon base semiconductor slice having a glassy borosilicate layer on a first region and a glassy phosphosilicate layer on a second region with a uniform and adherent nickel coating by electroless plating techniques, the improvement which comprises:
   dissolving the glassy borosilicate and phosphosilicate layers in a concentrated hydrofluoric acid bath; and
   immersing the slice in a hot aqueous solution of ammonium hydroxide prior to treatment with the nickel plating solution.

6. A method as defined in claim 5 wherein said first region is on one surface and said second region is on another surface of said slice.

7. In a method of rendering a doped silicon slice susceptible for receiving an electroless deposition of nickel on opposite sides, wherein a first side is doped with phosphorous and has a layer of a glassy phosphosilicate thereon, and the other side is doped with boron and has a layer of glassy borosilicate formed thereon:
   dissolving both glassy layers in a hydrofluoric acid bath leaving the exposed underlaying phosphorous doped surface passive to electroless deposition of nickel; and then
   treating the passive surface with ammonium hydroxide to render this surface susceptible for receiving an electroless deposition of nickel.

8. A method of plating a uniform and adherent nickel coating on a silicon base semiconductor slice having a glassy phosphosilicate layer on one phosphorous doped surface of the slice and a glassy borosilicate layer on the other boron doped surface, the improvement which comprises:
   immersing the slices in concentrated hydrofluoric acid for a period of 10–15 minutes to remove the glassy layers and render the phosphorous doped surface passive to electroless deposition of nickel;
   treating the slice in an aqueous solution of ammonium hydroxide for a period of 4–6 minutes heated to a temperature of 80–90° C. and having a Ph of 8–10;
   immersing the slice in concentrated hydrofluoric acid for a period not to exceed 3 minutes to remove oxides formed during the preceding step; and
   electroless plating the surface of the slice with nickel.

References Cited

UNITED STATES PATENTS 2,962,394 11/1960 Andres ............. 117—213

ALFRED L. LEAVITT, Primary Examiner

W. E. BALL, Assistant Examiner

U.S. Cl. X.R.

117—217; 156—17